(12) United States Patent
Shen et al.

(10) Patent No.: US 8,581,382 B2
(45) Date of Patent: Nov. 12, 2013

(54) INTEGRATED CIRCUIT PACKAGING SYSTEM WITH LEADFRAME AND METHOD OF MANUFACTURE THEREOF

(75) Inventors: Guo Qiang Shen, Shanghai (CN); Jae Hak Yee, Shanghai (CN); Feng Yao, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 183 days.

(21) Appl. No.: 12/818,750

(22) Filed: Jun. 18, 2010

(65) Prior Publication Data

US 2011/0309530 A1  Dec. 22, 2011

(51) Int. Cl.
*H01L 23/48* (2006.01)
*H01L 23/52* (2006.01)

(52) U.S. Cl.
USPC ............. 257/692; 257/676; 257/E21.504

(58) Field of Classification Search
CPC ................... H01L 23/31; H01L 21/56
USPC .................. 257/788, 692, 676, E21.504
See application file for complete search history.

(56) References Cited

U.S. PATENT DOCUMENTS

| | | | |
|---|---|---|---|
| 5,854,511 A * | 12/1998 | Shin et al. ............ | 257/713 |
| 6,075,282 A * | 6/2000 | Champagne ........... | 257/675 |
| 6,188,130 B1 * | 2/2001 | Ramirez et al. ....... | 257/706 |
| 6,198,163 B1 * | 3/2001 | Crowley et al. ....... | 257/706 |
| 6,242,281 B1 * | 6/2001 | Mclellan et al. ...... | 438/106 |
| 6,249,433 B1 * | 6/2001 | Huang et al. .......... | 361/704 |
| 6,281,568 B1 | 8/2001 | Glenn et al. | |
| 6,396,139 B1 * | 5/2002 | Huang ................... | 257/696 |
| 6,433,277 B1 * | 8/2002 | Glenn ................... | 174/537 |
| 6,525,406 B1 * | 2/2003 | Chung et al. .......... | 257/666 |
| 6,605,866 B1 * | 8/2003 | Crowley et al. ....... | 257/692 |
| 6,838,752 B2 * | 1/2005 | Diot ..................... | 257/666 |
| 7,045,396 B2 * | 5/2006 | Crowley et al. ....... | 438/123 |
| 7,105,378 B2 * | 9/2006 | Ng et al. ............... | 438/111 |
| 7,211,471 B1 | 5/2007 | Foster | |
| 7,400,049 B2 * | 7/2008 | Shim et al. ............ | 257/796 |
| 7,414,318 B2 * | 8/2008 | Shim et al. ............ | 257/778 |
| 7,456,499 B2 * | 11/2008 | Loh et al. .............. | 257/710 |
| 7,804,159 B2 * | 9/2010 | Shimanuki ............ | 257/666 |
| 2007/0187839 A1 * | 8/2007 | Shim et al. ............ | 257/784 |
| 2009/0072367 A1 | 3/2009 | Poddar et al. | |
| 2011/0285002 A1 * | 11/2011 | Do et al. ............... | 257/676 |
| 2012/0074547 A1 * | 3/2012 | Do et al. ............... | 257/676 |

* cited by examiner

*Primary Examiner* — Jarrett Stark
(74) *Attorney, Agent, or Firm* — Ishimaru & Associates LLP

(57) ABSTRACT

A method of manufacture of an integrated circuit packaging system includes: forming a paddle having an indented planar surface intersecting an outwardly extending planar surface at an angle of approximately 135 degrees plus 25 degrees or minus 5 degrees; mounting an integrated circuit over the paddle; and forming an encapsulation over the integrated circuit and under the extension void free.

10 Claims, 2 Drawing Sheets

INTEGRATED CIRCUIT PACKAGING SYSTEM WITH LEADFRAME AND METHOD OF MANUFACTURE THEREOF

TECHNICAL FIELD

The present invention relates generally to an integrated circuit packaging system, and more particularly to a system for an integrated circuit packaging system with leadframe.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

As electronic devices have become smaller and thinner, the packages for protecting and interconnecting IC chips particularly power IC have the same trend, too.

The goals in designing and manufacturing semiconductor devices have been to make the devices smaller, more complex, with higher densities, and to include additional features. One method that improves the features and the densities of the semiconductor devices is to shrink the line sizes used in the lithographic process step in fabricating semiconductor devices. For example, each one-half reduction in line width of the circuits of the semiconductor device corresponds to a four-fold increase in chip density for the same size device.

Unfortunately, increasing density simply through improved lithographic techniques is limited because of physical limits and the cost factor of scaling down the dimensions of the semiconductor device. Accordingly, many attempts to increase semiconductor device density have been pursued. One such alternative has been the stacking of multiple semiconductor devices.

Thus, a need still remains for an integrated circuit packaging system providing increasing density without sacrificing reliability, yield, and high volume manufacturing processes. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a paddle having an indented planar surface intersecting an outwardly extending planar surface at an angle of approximately 135 degrees plus 25 degrees or minus 5 degrees; mounting an integrated circuit over the paddle; and forming an encapsulation over the integrated circuit and under the extension void free.

The present invention provides an integrated circuit packaging system, including: a paddle having an indented planar surface intersecting an outwardly extending planar surface at an angle of approximately 135 degrees plus 25 degrees or minus 5 degrees; an integrated circuit over the paddle; and an encapsulation over the integrated circuit and under the extension void free.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
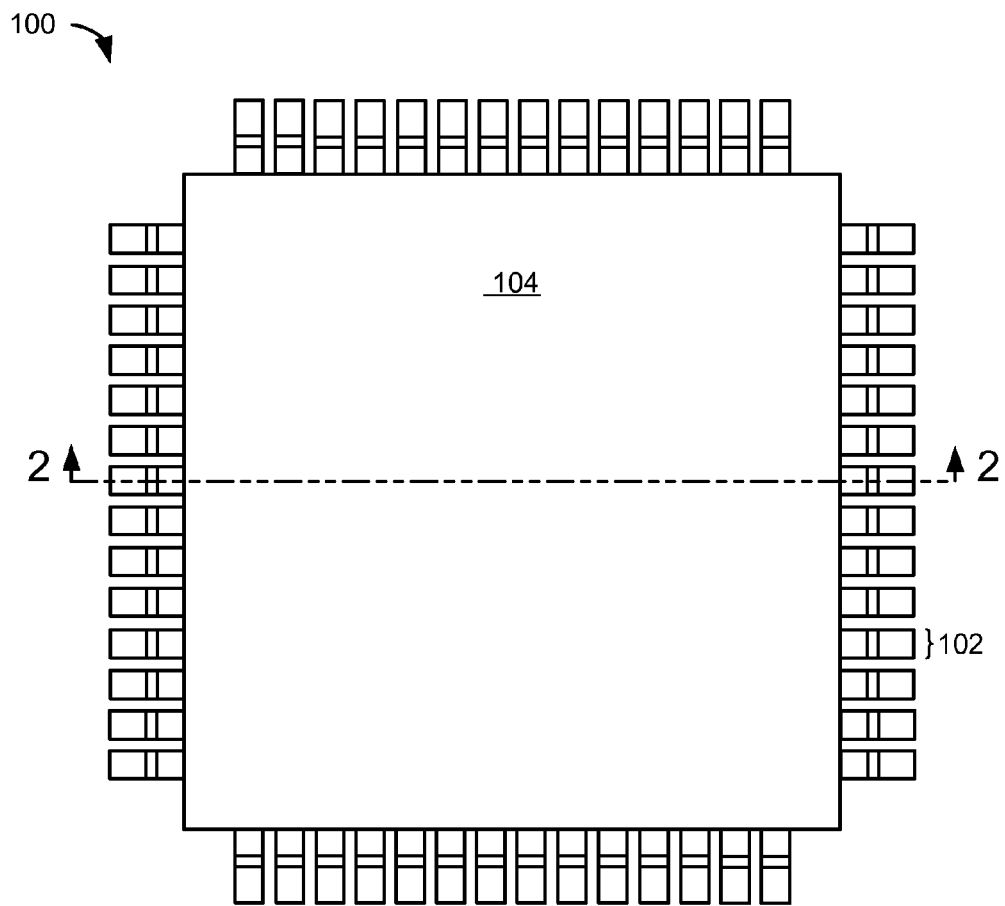
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. For example, the integrated circuit packaging system 100 can be used in applications for quad flat package (QFP) with exposed pad.

The integrated circuit packaging system 100 can include a lead finger 102, such as a lead or a terminal, at a perimeter of an encapsulation 104, such as a cover including an encapsulant, an epoxy molding compound (EMC), or a molding material. For example, the encapsulation 104 can be formed with EMC fillers having sizes in an approximate range from 1 micrometer (um) to 75 micrometers (um).

Figure 2:
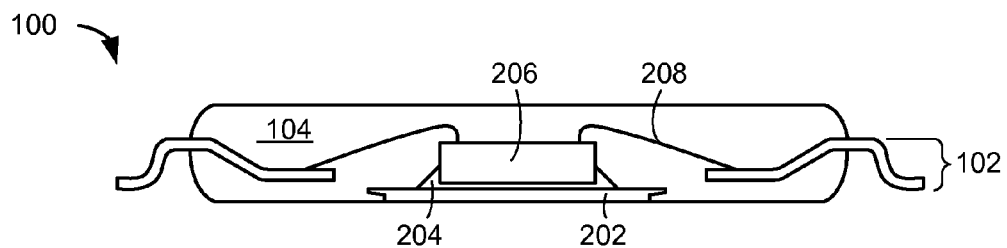
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a paddle 202, such as a die-attach paddle (DAP), a die-attach pad, or a die pad.

The paddle 202 can be adjacent to the lead finger 102. The paddle 202 can be surrounded by the lead finger 102. The paddle 202 and the lead finger 102 can be portions of a leadframe (not shown).

An adhesive 204, such as a film, an epoxy, or a conductive adhesive, can be attached to the paddle 202 and an integrated circuit 206, such as an integrated circuit die, a wirebond integrated circuit, or a chip. The adhesive 204 can conduct heat away from the integrated circuit 206 to the paddle 202.

The integrated circuit 206 can be mounted over the paddle 202. An interconnect 208, such as a bond wire, a ribbon bond wire, or a conductive wire, can be connected to the lead finger 102 and the integrated circuit 206.

The encapsulation 104 can be formed over the lead finger 102, the paddle 202, the adhesive 204, the integrated circuit 206, and the interconnect 208. The encapsulation 104 can partially cover the lead finger 102 and the paddle 202.

A portion of the lead finger 102 can be exposed from the encapsulation 104 at non-horizontal sides of the encapsulation 104 to provide connectivity between the integrated circuit 206 and external systems (not shown). The paddle 202 can be partially exposed from the encapsulation 104.

Figure 3:
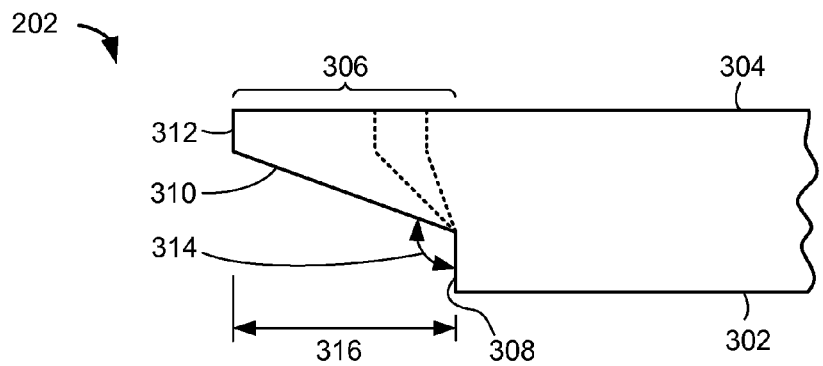
FIG. 3 is a more detailed view of a portion of the paddle.

Referring now to FIG. 3, therein is shown a more detailed view of a portion of the paddle 202. The paddle 202 can have a bottom side 302 and a top side 304 opposite to the bottom side 302. The bottom side 302 can be approximately parallel to the top side 304.

The paddle 202 can include an extension 306 from the top side 304 over the bottom side 302. The extension 306 can horizontally extend beyond the bottom side 302.

The extension 306 can be formed at a periphery of the paddle 202. The extension 306 can have a shape or a structure that is formed by an indented planar surface 308, an outwardly extending planar surface 310, and a non-indented planar surface 312.

The indented planar surface 308 can be formed to continue from the bottom side 302. The outwardly extending planar surface 310 can be formed to continue from the indented planar surface 308. The non-indented planar surface 312 can be formed to continue from the outwardly extending planar surface 310 and between the outwardly extending planar surface 310 and the top side 304.

The outwardly extending planar surface 310 is between the indented planar surface 308 and the non-indented planar surface 312. The indented planar surface 308 can be approximately parallel to the non-indented planar surface 312.

The extension 306 can extend between the indented planar surface 308 and the non-indented planar surface 312. The extension 306 horizontally extends from the indented planar surface 308. The outwardly extending planar surface 310 can be a lower planar surface of the extension 306. An upper planar surface of the extension 306 can be at the top side 304.

The indented planar surface 308 can be a vertical planar surface that is perpendicular to the bottom side 302. The indented planar surface 308 can intersect the outwardly extending planar surface 310.

The indented planar surface 308 can be at an angle 314 with the outwardly extending planar surface 310. The angle 314 is defined as an angle taken or measured from an exterior of the extension 306 and between the indented planar surface 308 and the outwardly extending planar surface 310.

The angle 314 can preferably be of approximately 135 degrees plus 25 degrees or minus 5 degrees. For example, the angle 314 can be in an approximate range from 130 degrees to 145 degrees. Also for example, the angle 314 can be in an approximate range from 130 degrees to 140 degrees.

The outwardly extending planar surface 310 can be a non-vertical planar surface that is non-perpendicular to the indented planar surface 308 and the non-indented planar surface 312. The outwardly extending planar surface 310 can intersect the non-indented planar surface 312.

The non-indented planar surface 312 can intersect the top side 304. For illustrative purposes, the non-indented planar surface 312 is shown as a vertical planar surface that is perpendicular to the top side 304, although the non-indented planar surface 312 can be a non-vertical planar surface that is non-perpendicular to the top side 304.

For example, the paddle 202 can have a length ratio of a length of the outwardly extending planar surface 310 over a length of the indented planar surface 308 in an approximate range from 0.3 to 2.7, based on the angle 314 of approximately 135 degrees plus 25 degrees or minus 5 degrees. Also for example, the paddle 202 can have a length ratio of the length of the outwardly extending planar surface 310 over a length of the non-indented planar surface 312 in an approximate range from 0.3 to 8.5, based on the angle 314 of approximately 135 degrees plus 25 degrees or minus 5 degrees.

The outwardly extending planar surface 310 can extend and intersect the non-indented planar surface 312 at a horizontal distance 316 away from the indented planar surface 308. The horizontal distance 316 is defined as a length of the extension 306 between the indented planar surface 308 and the non-indented planar surface 312.

As the angle 314 increases, the horizontal distance 316 can decrease. For example, a length ratio of the horizontal distance 316 over the length of the indented planar surface 308 can be in an approximate range from 0.3 to 2.4, based on the angle 314 of approximately 135 degrees plus 25 degrees or minus 5 degrees.

For illustrative purposes, the angle 314 is shown as 130 degrees, although the angle 314 can be different. For example, the angle 314 can be 135 degrees or 160 degrees as shown by dotted lines.

The paddle 202 can be formed by stamping or other mechanical processes. For example, the extension 306 can be formed by stamping the paddle 202 such that the indented planar surface 308 is at the angle 314 with the outwardly extending planar surface 310.

The paddle 202 can be partially exposed from the encapsulation 104 of FIG. 1. The bottom side 302 can be exposed from the encapsulation 104. The bottom side 302 can be coplanar with the encapsulation 104.

The bottom side 302 can be mounted over external systems (not shown). For example, the bottom side 302 can be attached to an external printed circuit board. Also for example, the bottom side 302 can be grounded by being connected to ground, an external ground potential, or an electrical reference point that is external to the integrated circuit packaging system 100 of FIG. 1.

While other paddles have what appear to be similar angles, the problems that have been discovered have gone undetected and unrecognized. It has been only through a thorough study of the problems that the answer was realized that the angle 314 was critical to solving the problems.

It has been discovered that the indented planar surface 308 intersecting the outwardly extending planar surface 310 at the angle 314 provides improved reliability. Based on failure analysis, tiny delamination occurs in gaps under stamped areas or half-etched areas of leadframe designs and has more chance to occur due to big epoxy mold compound (EMC) fillers clogging the gaps. With angle 314, a gap under the outwardly extending planar surface 310 has sufficient spacing to fill the encapsulant to allow improved moldability. The improved moldability prevents voids and porosity surfaces that can cause delamination thereby satisfying customer requirements of no delamination allowed at any area, compared to traditional designs that use the same encapsulant.

It has also been discovered that the paddle 202 having the angle 314 allows the encapsulation 104 that is not only void free but also has a mold lock feature that reliably secures the paddle 202 in the encapsulation 104. The angle 314 has an approximate range. The approximate range is set on one end by the need to hold the encapsulation 104 and is set on the other end by the need to have the encapsulation 104, having approximately 1-75 micrometers (um) size filler, be able to fill the underside of the paddle 202 (e.g. below the outwardly extending planar surface 310). If the angle 314 is less than 130 degrees, the voids increase. If the angle 314 is greater than 160 degrees, the horizontal distance 316 of the extension 306 is too small for the paddle 202 to be sufficiently locked in the encapsulation 104. With the angle 314 preferably at 135 degrees, a balance of having the encapsulation 104 free of the voids and the mold lock feature is achieved. It is therefore critical that the angle 314 is approximately 135 degrees plus 25 degrees or minus 5 degrees.

It has further been discovered that the paddle 202 having the angle 314 allows a more compact footprint of the integrated circuit packaging system 100. Based on the angle 314, the paddle 202 has the length ratio of the horizontal distance 316 over the length of the indented planar surface 308 in the approximate range from 0.3 to 2.4. As the angle 314 increases to approximately 160 degrees, not only is the paddle 202 sufficiently locked in the encapsulation 104 but the horizontal distance 316 decreases thereby allowing the footprint to be more compact.

Figure 4:
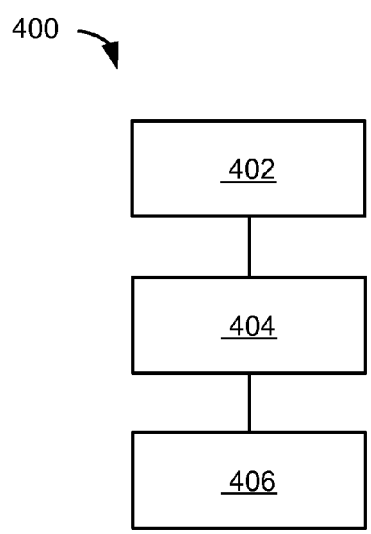
FIG. 4 is a flow chart of a method of manufacture of the integrated circuit packaging system in a further embodiment of the present invention.

Referring now to FIG. 4, therein is shown a flow chart of a method 400 of manufacture of the integrated circuit packaging system 100 in a further embodiment of the present invention. The method 400 includes: forming a paddle having an indented planar surface intersecting an outwardly extending planar surface at an angle of approximately 135 degrees plus 25 degrees or minus 5 degrees in a block 402; mounting an integrated circuit over the paddle in a block 404; and forming an encapsulation over the integrated circuit and under the extension void free in a block 406.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a paddle having an extension, an indented planar surface, and an outwardly extending planar surface, the extension horizontally extending from the indented planar surface, the indented planar surface intersecting the outwardly extending planar surface at an angle in a range from 130 degrees to 160 degrees, the angle measured from an exterior of the extension and between the indented planar surface and the outwardly extending planar surface;
   an integrated circuit over the paddle; and
   an encapsulation over the integrated circuit and under the extension void free.

2. The system as claimed in claim 1 wherein the paddle includes the paddle with the angle in a range from 130 degrees to 145 degrees.

3. The system as claimed in claim 1 wherein the paddle includes the paddle with the angle in a range from 130 degrees to 140 degrees.

4. The system as claimed in claim 1 wherein the paddle includes the paddle having a non-indented planar surface intersecting the outwardly extending planar surface, the non-indented planar surface non-perpendicular to the outwardly extending planar surface.

5. The system as claimed in claim 1 wherein the paddle includes the paddle having a top side and a non-indented planar surface intersecting the top side, the non-indented planar surface perpendicular to the top side.

6. The system as claimed in claim 1 wherein the encapsulation partially exposes the paddle.

7. The system as claimed in claim 6 wherein the paddle includes the paddle having a length ratio of the outwardly extending planar surface and the indented planar surface in a range from 0.3 to 2.7 based on the angle.

8. The system as claimed in claim 6 wherein the paddle includes the paddle having a non-indented planar surface and a length ratio of the outwardly extending planar surface and the non-indented planar surface in a range from 0.3 to 8.5 based on the angle.

9. The system as claimed in claim 6 wherein the paddle includes the paddle having the outwardly extending planar surface extended at a horizontal distance away from the indented planar surface and a length ratio of the horizontal distance and the indented planar surface in a range from 0.3 to 2.4 based on the angle.

10. The system as claimed in claim 6 wherein the paddle includes the paddle having a top side and a non-indented planar surface intersecting the top side, the non-indented planar surface non-perpendicular to the top side.

* * * * *